United States Patent [19]

Susak

[11] Patent Number: 4,730,127

[45] Date of Patent: Mar. 8, 1988

[54] METHOD OF MATCHING CURRENTS FROM SPLIT COLLECTOR LATERAL PNP TRANSISTORS

[75] Inventor: David M. Susak, Mesa, Ariz.

[73] Assignee: Motorola, Inc., Schaumburg, Ill.

[21] Appl. No.: 944,047

[22] Filed: Dec. 22, 1986

[51] Int. Cl.$^4$ ............... H03K 19/091; H03K 19/003; H03K 17/12; H03K 17/16

[52] U.S. Cl. .................. 307/299.3; 307/459; 307/477; 307/303; 357/36; 340/347 R

[58] Field of Search ............ 307/299 B, 491, 492, 307/494, 496, 500, 351, 355, 357, 268, 270, 303, 264, 477, 459; 357/35, 36, 92; 340/347

[56] References Cited

U.S. PATENT DOCUMENTS

| | | | |
|---|---|---|---|
| 3,771,030 | 11/1973 | Gilbert | 307/303 X |
| 3,893,017 | 7/1975 | Williams | 357/36 X |
| 3,995,304 | 11/1976 | Pease | 357/36 |
| 4,274,018 | 6/1981 | Cave et al. | 307/299 B X |
| 4,513,306 | 4/1985 | Davies | 357/36 |

Primary Examiner—Stanley D. Miller
Assistant Examiner—David R. Bertelson
Attorney, Agent, or Firm—Vincent B. Ingrassia

[57] ABSTRACT

This relates to a method of generating at least first and second matched currents from first and second multiple collector transistors. The first transistor has a base region, a first emitter region and a plurality of collector regions. The second transistor has a second emitter region disposed in the base region and also has a plurality of collector regions. Matched currents are taken one each from a collector of the first and second transistors, which collectors occupy corresponding position with respect to their associated emitter regions.

5 Claims, 2 Drawing Figures

METHOD OF MATCHING CURRENTS FROM SPLIT COLLECTOR LATERAL PNP TRANSISTORS

BACKGROUND OF THE INVENTION

This invention relates generally to split collector transistors, and more particularly, to a method of matching currents appearing at the split collectors of lateral PNP transistors.

The use of split collector transistors is well known and is desirable for a number of reasons. For example, if it weren't for the use of multiple collectors, a great many more transistors would be required to provide the necessary current sources for a particular circuit application thus occupying more die area on an integrated circuit. Additionally, a classic method of generaing currents having specific ratios with respect to each other involve the use of split collector lateral PNP transistors. That is, the emitter of each transistor emits the available current and each collector sections associated with each emitter each collect a portion of the current depending upon the ratio of its area with respect to the other collectors. Thus, theoretically, it is possible to match currents by extracting them from collectors having substantially identical areas. Unfortunately, when the split collector transistor is subjected to mechanical stresses such as those associated with the mounting and packaging of the integrated circuit, the currents associated with collectors of substantially identical area and which occupy the same percentage of the circumference around their emitter become mismatched. Therefore, a method is needed to derive matched currents from split collector transistors which remain matched even though subjected to mechanical stress.

SUMMARY OF THE INVENTION

It is an object of the present invention to provide an improved method of producing matched currents from split collector transistors.

It is a further object of the present invention to provide a method for deriving currents from split collector transistors which substantially reduces the mismatch due to stress and preohmic shift.

According to a broad aspect of the invention there is provided a method of generating at least first and second matched currents, comprising providing a first transistor having a base region, a first emitter region, and at least a first collector region for generating the first matched current. A second transistor is provided having a second emitter region electrically coupled to the first emitter region and disposed within the base region, and at least a second collector region for generating the second matched current. The first collector region has a location with respect to the first emitter region which corresponds to the location of the second collector region with respect to the second emitter region.

The above and other objects, features, and advantages of the present invention will be more clearly understood from the following detailed description taken in conjunction with the accompanying drawings, in which:

DESCRIPTION OF THE PREFERRED EMBODIMENT

Figure 1:
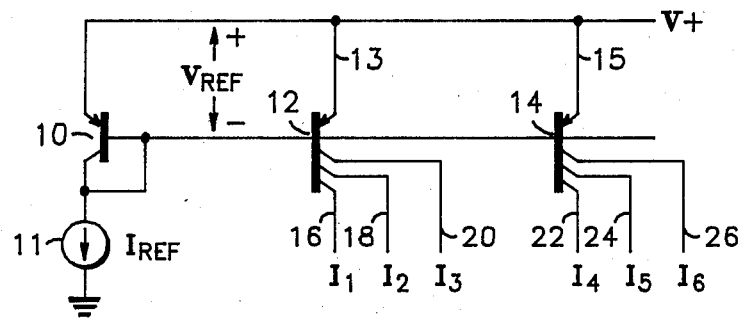
FIG. 1 is a schematic diagram of a portion of a circuit utilizing split collector PNP transistors in the well known manner.
Figure 2:
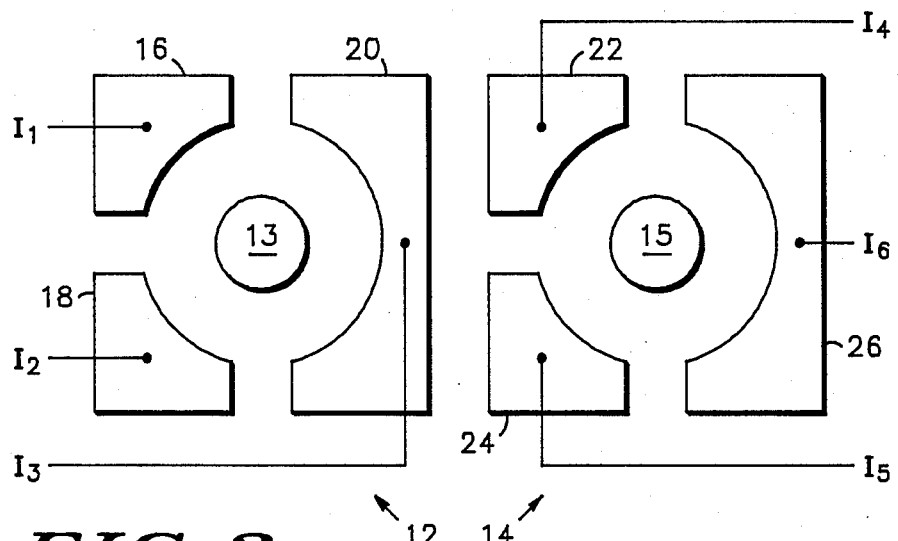
FIG. 2 is a plan view of the layout of the split collector transistors shown in FIG. 1 which is useful in describing the inventive method.

FIG. 1 is a schematic diagram of a typical circuit employing split collector transistors. As can be seen, PNP transistor 10 has its emitter coupled to a source of supply voltage V+ and its collector coupled to its base and to current source 11 which generates a reference current $I_{REF}$ for producing $V_{REF}$. The circuit includes first and second split collector PNP transistors. Transistor 12 has an emitter coupled to V+ and first, second and third collectors 16, 18 and 20 respectively for conducting currents $I_1$, $I_2$, and $I_3$ respectively. Transistor 14 has an emitter coupled to V+ and first, second and third collectors 22, 24 and 26 respectively for conducting currents $I_4$, $I_5$, and $I_6$ respectively. Assumed that it is desired to produce currents $I_1=I_2=I_4=I_5=0.25$ $I_{REF}$ and $I_3=I_6=0.5$ $I_{REF}$. This may be accomplished as is shown in FIG. 2 by providing first and second discrete emitter regions 13 and 15 of transistors 12 and 14 respectively each surrounded by first and second quarter collectors and one half collector. That is, emitter 13 of transistor 12 is surrounded by first and second quarter collectors 16 and 18 and half collector 20, and emitter 15 of transistor 14 is surrounded by first and second quarter collectors 22 and 24 and half collector 26. Thus, transistor 12 includes collector regions 16 and 18 which occupy the same positions with respect to emitter 13 as do collector regions 22 and 24 with respect to emitter region 15 of transistor 14. Similarly, collector region 20 of transistor 12 occupies the same position relative emitter 13 as does collector region 26 of transistor 14 relative emitter region 15.

Since quarter collector regions 16 and 18 are of the same area, it may be assumed that I1 and I2 are matched. Similarly, it may be assumed that I4 and I5 are matched. However, it has been demonstrated that when mechanically stressed, currents $I_1$ and $I_2$ (or $I_4$ and $I_5$) can be mismatched by as much as 12 percent as a result of, for example, high stress packaging. In contrast, however, it has been found that not only does current $I_1$ match current $I_4$ after stressing but current $I_2$ matches $I_5$. Furthermore, it was found that current $I_1$ and $I_4$ rose in value together as a result of stressing while currents $I_2$ and $I_5$ fell in value together after stressing, thus remaining matched. After stressing, currents $I_1$ and $I_4$ (or currents $I_2$ and $I_5$) remain matched to $-0.5\%$. This is attributed to the fact that collectors 16 and 22 occupy corresponding positions with respect to their emitters 13 and 15 respectively. Similarly, collector regions 18 and 24 from which currents $I_2$ and $I_5$ are derived occupy corresponding positions with respect to their associated emitters 13 and 15 respectively. Thus, by deriving currents from collectors occupying corresponding positions with respect to discrete but electrically common emitter regions, current matching is significantly enhenaced even after stressing.

The above description is given by way of example only. Changes in form and details may be made by one skilled in the art without departing from the scope of the invention as defined by the appended claims.

I claim:

1. A method of generating at least first and second matched currents, comprising:

providing a first transistor having a base region, a first emitter region, and at least a first collector region for generating said first matched current; and providing a second transistor having a first emitter region electrically coupled to the first emitter region of said first transistor, and at least a first collector region for generating said second matched current, said first collector region of said first transistor having a location with respect to the first emitter region of said first transistor which corresponds to the location of the first collector region of said second transistor with respect to the first emitter region of said second transistor.

2. A method according to claim 1 further comprising: supplying a reference voltage to each of the base-emitter junctions of the first emitter regions of said first and second transistors to produce a reference current; and collecting substantially identical portions of said reference current at each of the first collector regions of said first and second transistors.

3. A method according to claim 2 wherein each of said first and second transistors includes a plurality of collector regions.

4. An integrated circuit for generating first and second matched currents, comprising:

a first transistor having a base region, a first emitter region, and at least a first collector region for collecting said first current;

a second transistor having a first emitter region electrically coupled to the first emitter region of said first transistor and disposed within said base region, and at least a first collector region for collecting said second current, the first collector region of said first transistor having a location with respect to the first emitter region of said first transistor which corresponds to the location of the first collector region of said second transistor with respect to the first emitter region of said second transistor; and means for supplying a reference voltage to the first emitter regions of said first and second transistors.

5. An integrated circuit according to claim 4 wherein each of said first and second transistors includes a plurality of collectors.

* * * * *